United States Patent
Zhou et al.

(10) Patent No.: US 12,408,296 B2
(45) Date of Patent: Sep. 2, 2025

(54) POWER DEVICE EMBEDDED PRINTED CIRCUIT BOARD-COLD PLATE ASSEMBLIES WITH LOW INTERFACIAL THERMAL AND MECHANICAL STRESSES AND METHODS OF MAKING THE SAME

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US); Yanghe Liu, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 228 days.

(21) Appl. No.: 18/114,622

(22) Filed: Feb. 27, 2023

(65) Prior Publication Data

US 2024/0292564 A1     Aug. 29, 2024

(51) Int. Cl.
*H05K 7/20* (2006.01)
*H05K 1/02* (2006.01)

(52) U.S. Cl.
CPC ....... *H05K 7/20254* (2013.01); *H05K 1/0272* (2013.01); *H05K 7/20927* (2013.01)

(58) Field of Classification Search
CPC .......... H05K 7/20254; H05K 7/20309; H05K 7/20336; H05K 7/20509; H05K 7/2089; H05K 7/20927; H05K 7/20936; H05K 1/0203; H05K 1/0204; H05K 1/0207; H05K 1/0209; H05K 1/0272; H05K 1/0298; H05K 1/05; H05K 1/183; H05K 1/185; H01L 23/3121; H01L 23/367; H01L 23/3675; H01L 23/3735; H01L 23/427; H01L 23/473; H01L 21/4803; H01L 21/4881; H01L 2224/04105
See application file for complete search history.

(56) References Cited

U.S. PATENT DOCUMENTS

| | | | |
|---|---|---|---|
| 2011/0163457 A1* | 7/2011 | Mohan | H01L 23/49822 257/E23.079 |
| 2014/0175633 A1* | 6/2014 | Lin | H01L 23/36 257/712 |

(Continued)

FOREIGN PATENT DOCUMENTS

JP     2017228623 A   * 12/2017

OTHER PUBLICATIONS

JP-2017228623-A English Translation (Year: 2017).*

*Primary Examiner* — Amir A Jalali
(74) *Attorney, Agent, or Firm* — Christopher G. Darrow; Darrow Mustafa PC (57) ABSTRACT

A highly integrated power electronics embedded PCB-cold plate assembly includes a cold plate, a power electronics embedded printed circuit board (PCB), and a low thermal resistance dielectric layer sandwiched between the cold plate and the power electronics embedded PCB. The power electronics embedded PCB is bonded to the cold plate via the low thermal resistance dielectric layer to form highly integrated power electronics embedded PCB—cold plate assembly is formed. And in one example, the low thermal resistance dielectric layer sandwiched between and directly bonded to the cold plate and the power electronics embedded PCB.

20 Claims, 6 Drawing Sheets

(56) References Cited

U.S. PATENT DOCUMENTS

| | | |
|---|---|---|
| 2014/0318830 A1 | 10/2014 | Robert |
| 2018/0366400 A1 | 12/2018 | Mohn et al. |
| 2019/0131208 A1 | 5/2019 | Feichtinger et al. |
| 2022/0013431 A1* | 1/2022 | Zhou .................. H01L 23/3677 |
| 2022/0053634 A1* | 2/2022 | Zhou ..................... H01L 23/427 |
| 2022/0065549 A1* | 3/2022 | Zhou .................. F28D 15/0275 |
| 2022/0070996 A1* | 3/2022 | Esler .................. H05K 7/20509 |
| 2022/0141951 A1* | 5/2022 | Zhou ...................... H05K 1/185 |
| | | 361/700 |
| 2022/0157693 A1* | 5/2022 | Zhou ...................... H01L 25/50 |
| 2022/0167528 A1* | 5/2022 | Joshi ................. H05K 7/20936 |
| 2022/0192002 A1* | 6/2022 | Zhou ........................ H05K 3/30 |
| 2022/0287209 A1 | 9/2022 | Reiter et al. |
| 2023/0022829 A1* | 1/2023 | Zhou .................. H01L 23/3735 |
| 2023/0238301 A1* | 7/2023 | Miorini .................. H01L 24/24 |
| | | 257/774 |
| 2024/0251507 A1* | 7/2024 | Ewanchuk ............. H05K 1/115 |

* cited by examiner

Max Temperature: 142 degC

FIG. 3B

Avg. Shear Stress 2.10 x$10^5$ N/m$^2$

FIG. 3C

Avg. Shear Stress 2.7 x$10^6$ N/m$^2$

POWER DEVICE EMBEDDED PRINTED CIRCUIT BOARD-COLD PLATE ASSEMBLIES WITH LOW INTERFACIAL THERMAL AND MECHANICAL STRESSES AND METHODS OF MAKING THE SAME

TECHNICAL FIELD

The present disclosure relates to printed circuit boards, and particularly to printed circuit boards with power devices embedded therein.

BACKGROUND

Printed circuit boards (PCBs) are typically used for mechanical support and electrical connection of electronic components using conductive pathways of copper sheets laminated onto a non-conductive substrate. And multi-layer PCBs provide higher capacity and/or density of electronic components in a smaller footprint by incorporating two or more layers. However, the design and/or manufacture of multilayer PCBs can be difficult.

The present disclosure addresses issues related to the manufacture of multi-layer PCBs and other issues related to multi-layer PCBs.

SUMMARY

This section provides a general summary of the disclosure and is not a comprehensive disclosure of its full scope or all of its features.

In one form of the present disclosure, an assembly includes a cold plate, a power electronics embedded printed circuit board (PCB), and a low thermal resistance (LTR) dielectric layer sandwiched between the cold plate and the power electronics embedded PCB such that the power electronics embedded PCB is bonded to the cold plate via the LTR dielectric layer and forms a highly integrated power electronics embedded PCB—cold plate assembly is formed.

In another form of the present disclosure, a highly integrated power electronics embedded PCB—cold plate assembly includes a cold plate, a power electronics embedded PCB, and a LTR dielectric layer sandwiched between and directly bonded to the cold plate and the power electronics embedded PCB.

In still another form of the present disclosure, a method includes laminating a LTR dielectric layer onto a cold plate fabrication panel, the cold plate fabrication panel including a plurality of individual cold plate units, bonding a power electronics embedded PCB fabrication panel to the LTR dielectric layer using high temperature and high pressure and forming an integrated power electronics PCB—cold plate fabrication panel, and cutting the integrated power electronics PCB—cold plate fabrication panel into a plurality of individual highly integrated power electronics embedded PCB—cold plate units.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

It should be noted that the figures set forth herein are intended to exemplify the general characteristics of the methods, devices, and systems among those of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides highly integrated power electronics embedded PCB—cold plate assemblies with desired heat transfer, and reduced normal and shear stresses, between a cold plate and a power electronics embedded PCB bonded thereto. As used herein, the phrase "highly integrated power electronics embedded PCB" refers to a single multi-layer PCB module or unit with two or more power semiconductor devices (also referred to herein simply as "power device"), control/drive/protection electronic circuitry, and passive components, embedded therein. Also, as used herein, the phrase "power device" refers to a semiconductor device used as a switch or rectifier in power electronics. The cold plate can be fluid cooled such that temperatures of the one or more power device—substrate assemblies during operation remain below a predefined temperature. In addition, the multi-layer PCB with the one or more power device—substrate assemblies embedded therein is electrically isolated from the cold plate via a low thermal resistance dielectric layer.

Figure 1A:
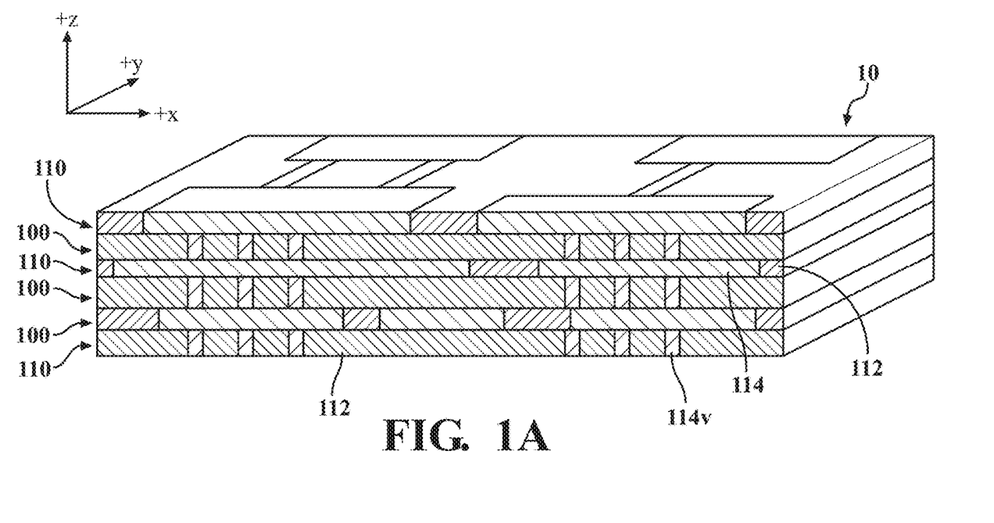
FIG. 1A shows a perspective view of a multi-layer PCB for a highly integrated power electronics embedded PCB—cold plate assembly according to the teachings of the present disclosure.
Figure 1B:
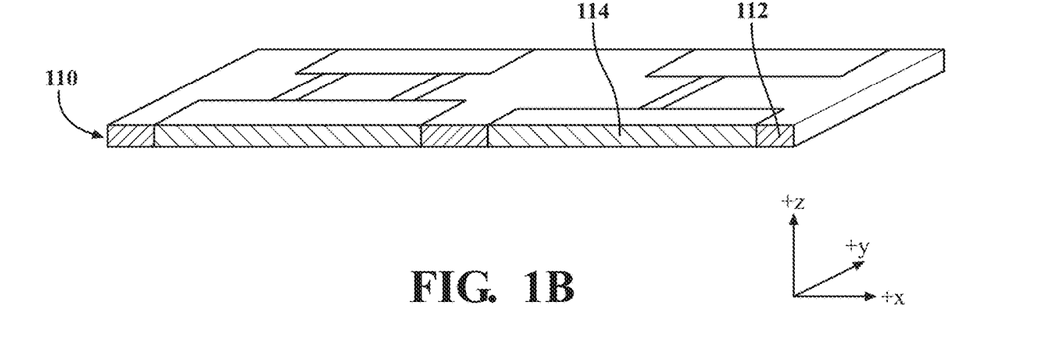
FIG. 1B shows a perspective for a power layer of the multi-layer PCB in FIG. 1A.

Referring now to FIGS. 1A-1B, a perspective cross-sectional view of a multi-layer PCB 10 is shown in FIG. 1A and an isolated perspective cross-sectional view of a power layer 110 of the multi-layer PCB 10 is shown in FIG. 1B. The multi-layer PCB 10 includes a plurality of dielectric layers 100 and a plurality of the power layers 110. The power layers 110 include a dielectric material 112 and a conductive material 114. The dielectric layers 100 include the dielectric material 112 and conductive vias 114v that provide electrical communication or pathways between adjacent power layers 110. Stated differently, the power layers 110 include conductive (e.g., copper) patterns and the dielectric layers 100 include conductive (e.g., copper) pathways that connect the conductive patterns 114 such that the multi-layer PCB 10 functions and/or operates as desired.

In some variations, the power layers 110 are formed from a glass reinforced epoxy laminate dielectric material (e.g., FR-4), or other dielectric material, with the conductive material 114 embedded therein. In other variations, the power layers 110 are 3D printed using a dielectric material ink to form the dielectric material 112, with the conductive material 114 embedded therein. And in at least one variation, the conductive material 114 is also 3D printed with a conductive material ink. Non limiting examples of dielectric material inks are inks that include UV-curable dielectric materials such as UV-curable acrylated monomer selected from one or more of an acrylate epoxy, an acrylate polyester, an acrylate urethane, and an acrylate silicone, among others. And non-limiting examples of conductive material inks are inks that include silver nanoparticles and/or graphene nanosheets, among others. It should be understood that the dielectric layers 100 can also be formed from a glass reinforced epoxy laminate dielectric material (e.g., FR-4), or other dielectric material, or 3D printed using a dielectric material ink.

The dielectric layers 100 and the power layers 110 have a predefined average thickness (z-direction). For example, in some variations, the predefined average thickness is between about 50 micrometers (μm) and about 250 μm, for example, between about 75 μm and about 200 μm. And in at least one variation, the predefined thickness is between about 75 μm and about 150 μm, for example, between about 80 μm and about 120 μm.

Figure 2:
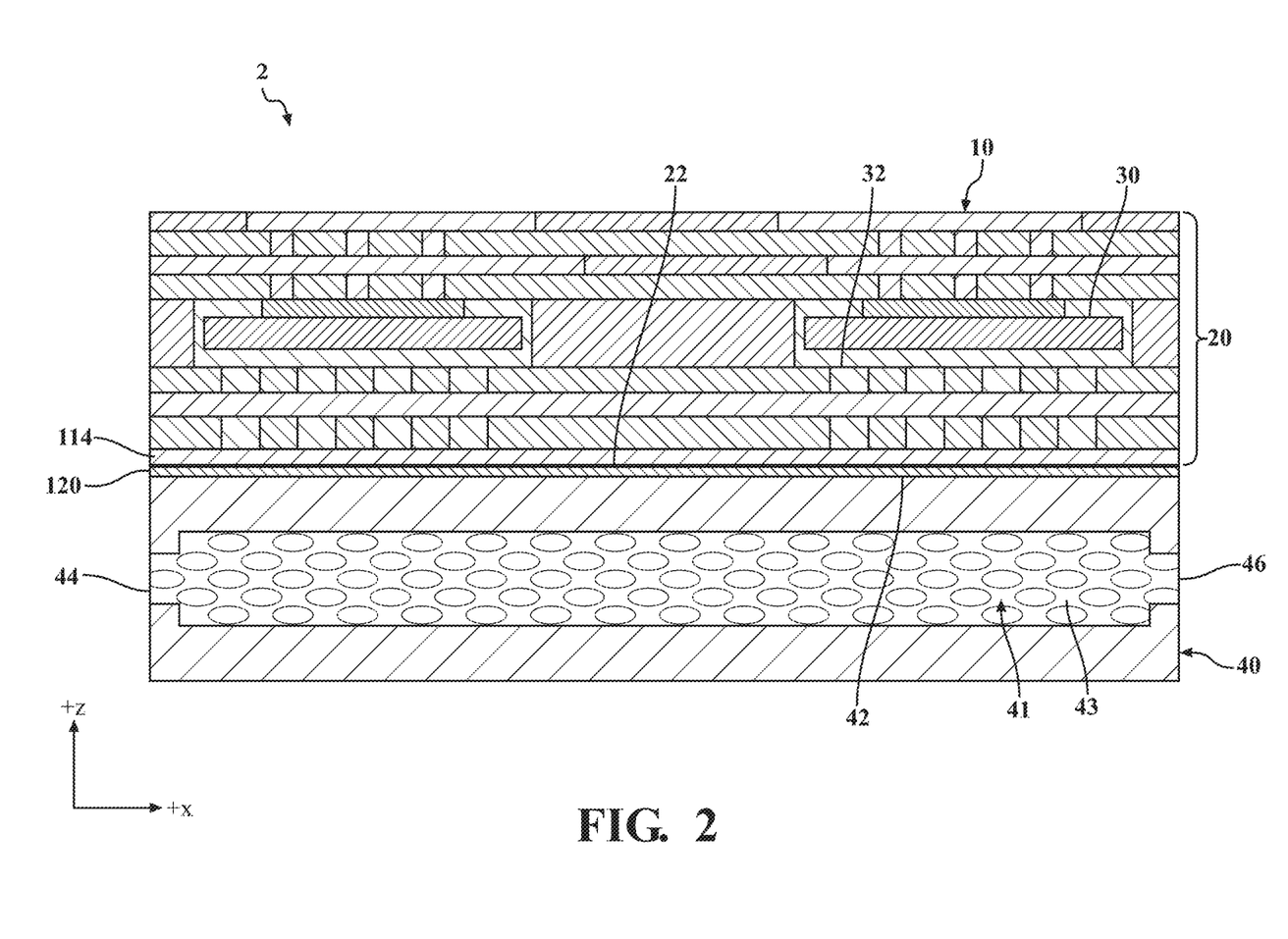
FIG. 2 shows a side view of a highly integrated power electronics embedded PCB—cold plate assembly according to the teachings of the present disclosure.

Referring to FIG. 2, a side view of a highly integrated power electronics embedded PCB—cold plate assembly 2 according to one form of the present disclosure is shown. The highly integrated power electronics embedded PCB—cold plate assembly 2 includes a power electronics embedded PCB 20 formed from the multi-layer PCB 10 with power device—substrate assemblies 30 embedded therein, and a cold plate 40. As used herein, the phrase power device—substrate assembly refers to a power device (e.g., a MOSFET power device) attached or bonded to a substrate. In some variations, the substrate is a copper-graphite substrate with a graphite core embedded within a shell of copper. And in such variations, the power device is bonded to the copper shell, e.g., via silver sintering.

In some variations, the power device—substrate assemblies 30 are totally embedded in the multi-layer PCB 10, i.e., one or more dielectric layers 100 and/or one or more power layers 110 are above (+z direction) the power device—substrate assemblies 30, and one or more dielectric layers 100 and/or one or more power layers 110 are below (−z direction) the power device—substrate assemblies 30. In other variations, the power device—substrate assemblies 30 form at least a portion of the lower surface 22 of the power electronics embedded PCB 20. For example, a lower surface 32 of one or more power device—substrate assemblies 30 is aligned or coplanar with the lower surface 22 of the power electronics embedded PCB 20 (not shown) such that the lower surfaces 22, 32 of the power electronics embedded PCB 20 and power device(s), respectively, are bonded to the cold plate via a low thermal resistance dielectric layer as described below.

The power electronics embedded PCB 20 is bonded to the cold plate 40 such that the power device—substrate assemblies 30 are in thermal communication with the cold plate 40. Accordingly, and during operation of the highly integrated power electronics embedded PCB—cold plate assembly 2, the power device—substrate assemblies 30 are cooled via the flow of heat from the power device—substrate assemblies 30 to the cold plate 40. In some variations, the cold plate 40 is formed form an electrically conductive material (e.g., aluminum) and it is desirable that a bonding interface between the power electronics embedded PCB 20 and the cold plate 40 exhibit desired electrical insulation and thermal conduction properties. And in at least one variation, the cold plate 40 includes an internal fluid chamber 41 with an inlet 44, an outlet 46, and porous, mesh-structured, machined, or cast heat sinks 43 disposed within the fluid chamber 41. As used herein, the phrase "bonding interface" refers to one or more layers employed or used to bond a power electronics embedded PCB to a cold plate. And in at least one variation, the phrase "bonding interface" refers to a low thermal resistance dielectric layer employed or used to bond a power electronics embedded PCB to a cold plate.

Still referring to FIG. 2, a low thermal resistance (LTR) dielectric layer 120 is disposed between the cold plate 40 and the power electronics embedded PCB 20. For example, in some variations, the LTR dielectric layer 120 is disposed between an upper (+z direction) surface 42 of the cold plate 40 and a lower (−z direction) surface 22 of the power electronics embedded PCB 20.

The LTR dielectric layer 120 can be formed from any dielectric material and/or dielectric composite material suitable to electrically isolate the power electronics embedded PCB 20 from the cold plate 40. In some variations, the LTR dielectric layer is a ceramic-polymer composite dielectric material such as $BaTiO_3$-polymer dielectric materials, $Pb(Zr_xTi_{1-x})O_3$-polymer dielectric materials ($0 \leq x \leq 1$), and/or $SrTiO_3$ dielectric materials, among others.

In some variations, the LTR dielectric layers according to the teachings of the present disclosure have an average thickness (z direction) less than about 250 μm, for example less than about 200 μm, less than about 150 μm, less than about 100 μm, less than about 50 μm, less than about 40 μm, less than about 30 μm, less than about 20 μm, or less than about 10 μm. In some variations the LTR dielectric layer has an average thickness between about 10 μm and about 50 μm, for example between about 20 μm and about 40 μm, or between about 25 μm and about 35 μm.

In some variations, the LTR dielectric layer 120 is bonded directly to the upper surface 42 of the cold plate 40, i.e., the LTR dielectric layer 120 is in direct contact with the upper surface 42. In at least one variation, the LTR dielectric layer 120 is bonded directly to the lower surface 22 of the power electronics embedded PCB 20. And in some variations, the LTR dielectric layer 120 is bonded directly to the upper surface 42 of the cold plate 40 and the lower surface 22 of the power electronics embedded PCB 20. As used herein, the phrase "directly bonded" refers to one component or layer being bonded to and in direct contact with another component or layer, i.e., without any additional components or layers therebetween. And while not shown in the figures, in some variations, a metallization layer can be included on an upper (+z direction) and/or lower (−z direction) surface of the LTR dielectric layer 120. For example, the cold plate 40 can be formed from an aluminum alloy and an aluminum and/or copper containing metallization layer can be included on the lower surface of the LTR dielectric layer 120. Also, the power electronics embedded PCB 20 can include a copper containing lower surface 22 and an aluminum and/or copper containing metallization layer can be included on the upper surface of the LTR dielectric layer 120.

In order to better illustrate the effectiveness of the highly integrated power electronics embedded PCB—cold plate assemblies disclosed herein, but not limit the scope thereof in any manner, results of thermal and mechanical stress simulations for the highly integrated power electronics embedded PCB—cold plate assembly 2 are provided and discussed below.

Figure 3A:
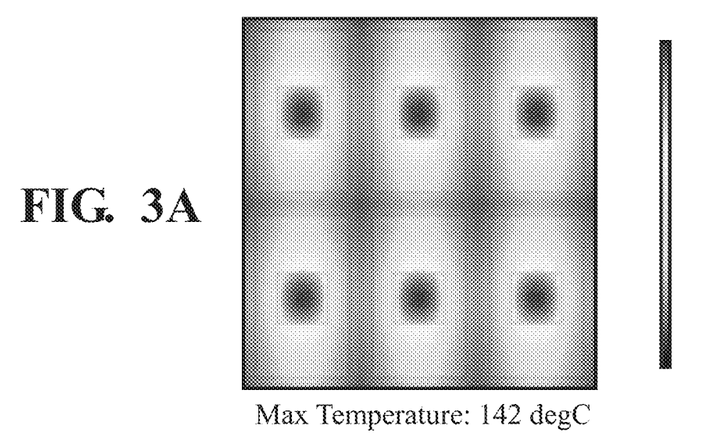
FIG. 3A shows a thermal simulation heat map for the highly integrated power electronics embedded PCB—cold plate assembly in FIG. 2.
Figure 3B:
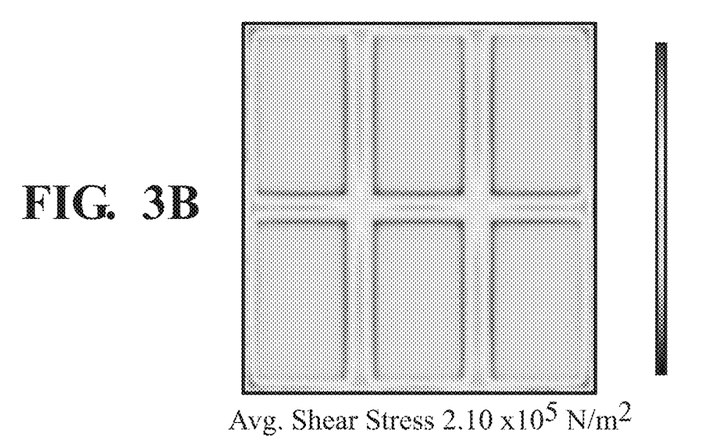
FIG. 3B shows a normal stress simulation map for a bonding interface of the highly integrated power electronics embedded PCB—cold plate assembly in FIG. 2.
Figure 3C:
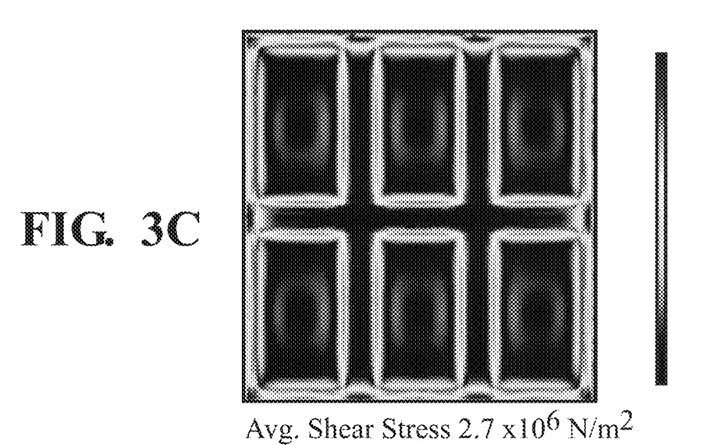
FIG. 3C shows a shear stress simulation map for the bonding interface of the highly integrated power electronics embedded PCB—cold plate assembly in FIG. 2.

Referring to FIGS. 3A-3C, results of thermal, normal stress, and shear stress simulations, respectively, for the highly integrated power electronics embedded PCB—cold plate assembly 2 with a LTR dielectric layer 120 bonding interface are shown. In addition, thermal, normal stress, and shear stress simulations for a highly integrated power electronics embedded PCB—cold plate assembly 2 with a grease layer—AlN layer—grease layer bonding interface (not shown) and a highly integrated power electronics embedded PCB—cold plate assembly 2 with a solder layer—AlN layer—solder layer bonding interface (not shown) were performed for comparison purposes.

The highly integrated power electronics embedded PCB—cold plate assembly 2 was modeled as having a power electronics embedded PCB 20 with six (6) SiC MOS power device—substrate assemblies 30 and a bonding interface formed or provided by a LTR dielectric layer 120 with a thermal conductivity of 3 W/m*K and a thickness of about 38 μm. Also, the highly integrated power electronics embedded PCB—cold plate assembly 2 was simulated as operating with six (6) MOSFET power devices and each MOSFET power device had a heat loss level of 286 W.

Regarding thermal simulation of the highly integrated power electronics embedded PCB—cold plate assembly 2 with the LTR dielectric layer 120 bonding interface, the maximum temperature of the SiC MOS power device—substrate assemblies 30 was about 142° C. (FIG. 3A). In contrast, thermal simulation of the highly integrated power electronics embedded PCB—cold plate assembly 2 with a grease layer—AlN layer—grease layer bonding interface between the power electronics embedded PCB 20 and the cold plate 40 showed a maximum temperature of about 166° C. for the SiC MOS power device—substrate assemblies 30. Also, thermal simulation of the highly integrated power electronics embedded PCB—cold plate assembly 2 with solder layer—AlN layer—solder layer bonding interface between the power electronics embedded PCB 20 and the cold plate 40 showed a maximum temperature of about 135° C. for the SiC MOS power device—substrate assemblies 30. Accordingly, a LTR dielectric layer 120 bonding interface resulted in a maximum temperature for the SiC MOS power device—substrate assemblies 30 24° C. less than a grease layer—AlN layer—grease layer bonding interface, and only 7° C. higher than a solder layer—AlN layer—solder layer bonding interface. Stated differently, the LTR dielectric layer 120 bonding interface provides desired heat transfer between SiC MOS power device—substrate assemblies embedded in a multi-layer PCB and a cold plate to which the multi-layer PCB, with power device—substrate assemblies embedded therein, is bonded.

Regarding normal stress simulation of the highly integrated power electronics embedded PCB—cold plate assembly 2 with the LTR dielectric layer 120 bonding interface (FIG. 3B), the average normal stress at the LTR dielectric layer 120 bonding interface was about $2.10 \times 10^5$ N/m². In contrast, normal stress simulation of the highly integrated power electronics embedded PCB—cold plate assembly 2 with the highly integrated power electronics embedded PCB—cold plate assembly 2 with the solder layer—AlN layer—solder layer bonding interface showed an average normal stress at the solder layer—AlN layer—solder layer bonding interface $5.28 \times 10^5$ N/m². Accordingly, a LTR dielectric layer 120 bonding interface resulted in a bonding interface normal stress reduction of about 60% compared to a solder layer—AlN layer—solder layer bonding interface.

And regarding shear stress simulation of the highly integrated power electronics embedded PCB—cold plate assembly 2 with the LTR dielectric layer 120 bonding interface (FIG. 3C), the average shear stress at the LTR dielectric layer 120 bonding interface was about $2.7 \times 10^6$ N/m². In contrast, shear stress simulation of the highly integrated power electronics embedded PCB—cold plate assembly 2 with the solder layer—AlN layer—solder layer bonding interface showed an average shear stress at the solder layer—AlN layer—solder layer bonding interface $6.0 \times 10^6$ N/m². Accordingly, a LTR dielectric layer 120 bonding interface resulted in a bonding interface shear stress reduction of about 55% compared to a solder layer—AlN layer—solder layer bonding interface.

Figure 4A:
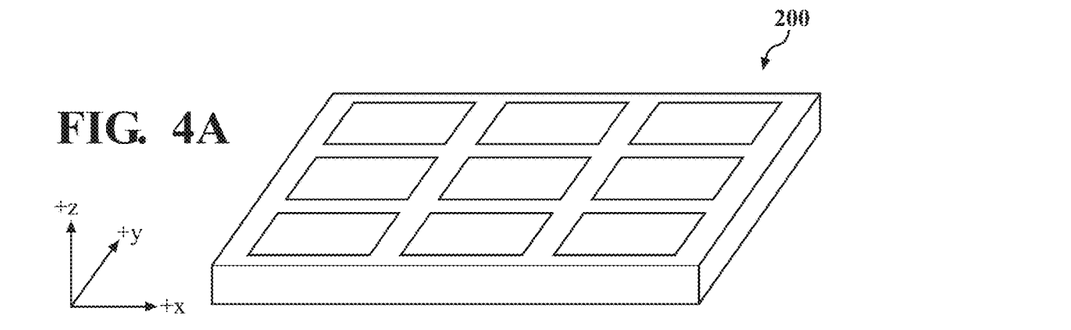
FIG. 4A shows a perspective view of a cold plate fabrication panel according to the teachings of the present disclosure.

Referring now to FIGS. 4A-4E, steps for manufacturing a plurality of highly integrated power electronics embedded PCB—cold plate assemblies 2 are shown. For example, FIG. 4A illustrates preparing or providing a cold plate fabrication panel 200 from which nine (9) separate cold plates 40 are formed. That is, the cold plate fabrication panel 200 is manufactured to have nine individual cold plates 40 after the cold plate fabrication panel 200 is cut or separated into individual cold plates units. And it should be understood that the cold plate fabrication panel 200 can be manufactured to have less than nine or more than nine individual cold plates 40 after the cold plate fabrication panel 200 is cut or separated into individual cold plates units.

Figure 4B:
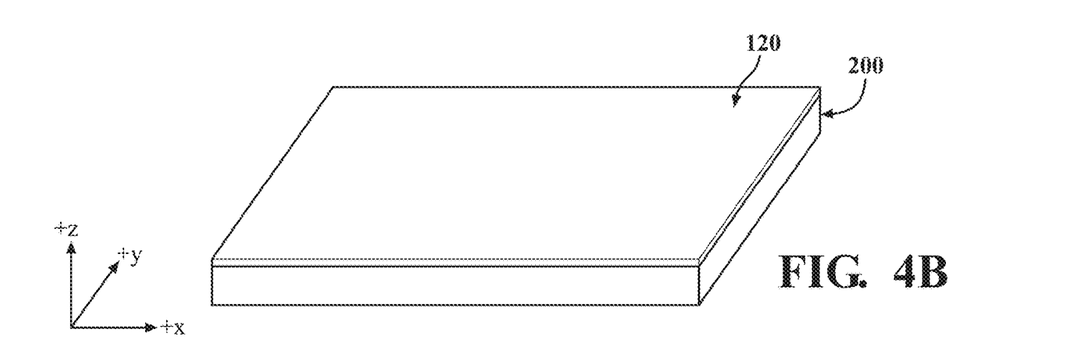
FIG. 4B shows a perspective view of an insulated metal substrate (IMS) deposited on the cold plate fabrication panel in FIG. 4A.
Figure 4C:
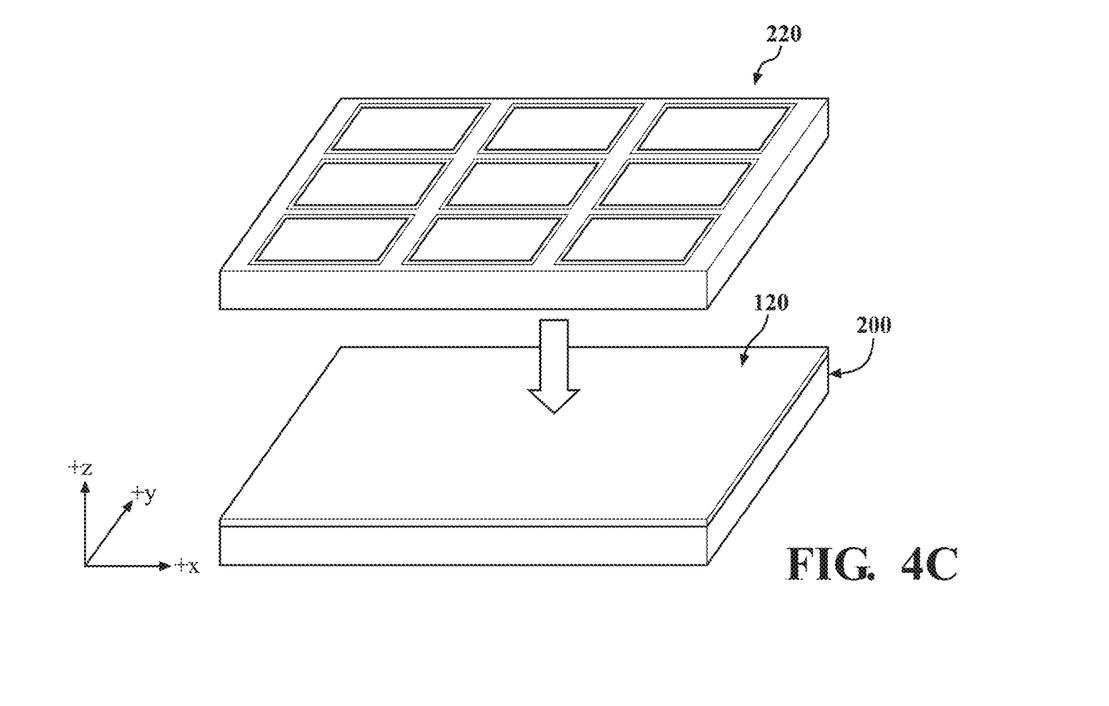
FIG. 4C shows a perspective view of a highly integrated power electronics embedded PCB fabrication panel to be bonded to the cold plate fabrication panel in FIG. 4B.

FIG. 4B illustrates laminating a LTR dielectric layer 120 onto the cold plate fabrication panel 200 and FIG. 4C illustrates bonding a power electronics embedded PCB fabrication panel 220 to the LTR dielectric layer 120, and thus to the cold plate fabrication panel 200. In some variations, the power electronics embedded PCB fabrication panel 220 is bonded to the LTR dielectric layer 120 using heat (i.e., elevated temperature) and pressure (i.e., elevated pressure). For example, in some variations pressures between about 2.1 megapascals (MPa) (300 pounds per square inch (psi)) and about 2.8 MPa (400 psi) are applied to the power electronics embedded PCB fabrication panel 220 and the LTR dielectric layer 120. In the alternative, or in addition to, the power electronics embedded PCB fabrication panel 220 and the LTR dielectric layer 120 are held at temperatures between about 150° C. (300° F.) and about 204° C. (400° F.).

Figure 4D:
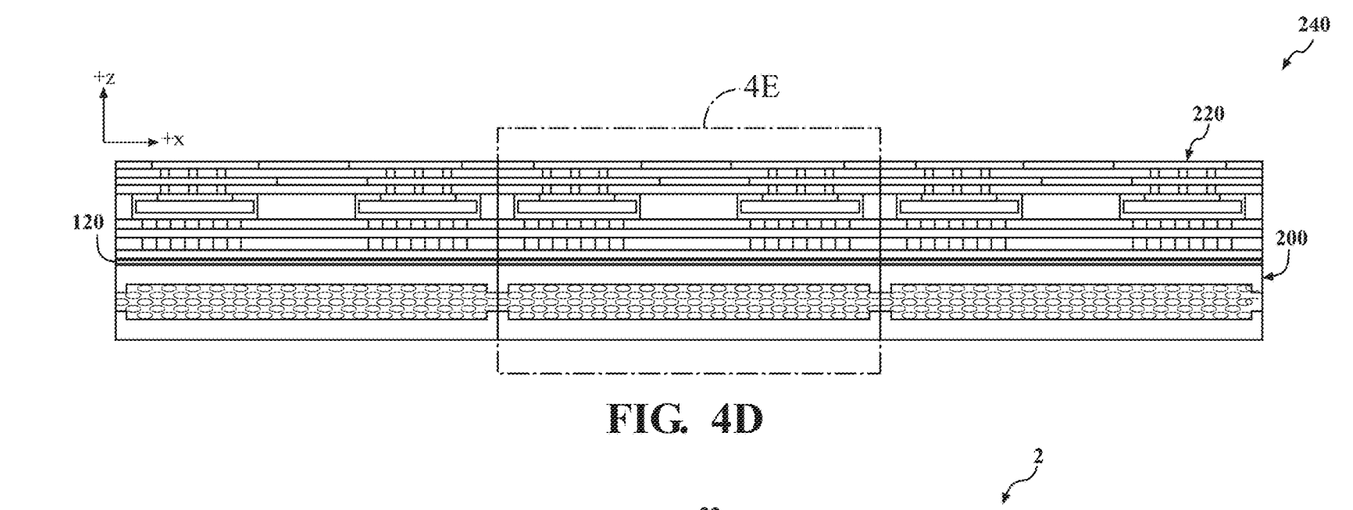
FIG. 4D shows a side view of the highly integrated power electronics embedded PCB fabrication panel bonded to the LTR dielectric layer deposited on the cold plate fabrication panel in FIG. 4C.
Figure 4E:
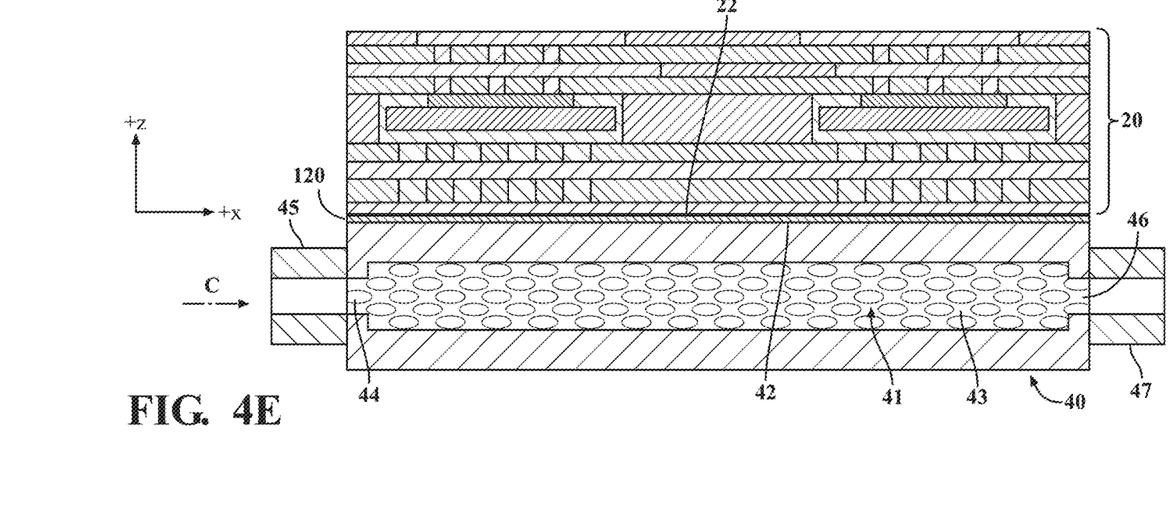
FIG. 4E shows a side cross-section view of section 4E in FIG. 4D.

FIG. 4D shows a side view of a highly integrated power electronics embedded PCB—cold plate assembly fabrication panel 240 formed from bonding of the power electronics embedded PCB fabrication panel 220 to the cold plate fabrication panel 200 via the LTR dielectric layer 120. FIG. 4E illustrates one of the highly integrated power electronics embedded PCB—cold plate assemblies 2 after cutting of the highly integrated power electronics embedded PCB—cold plate assembly fabrication panel 240 into nine separates units. And in some variations an inlet tube 45 is attached or bonded (e.g., soldered or press fit) to the inlet 44 and an outlet tube 47 is attached or bonded to the outlet 46 of the individual the highly integrated power electronics embedded PCB—cold plate assemblies 2 such that a coolant 'C' flows through the fluid chamber 41 and extracts heat from the power device—substrate assemblies 30 as illustrated in FIG. 4E.

Figure 5:
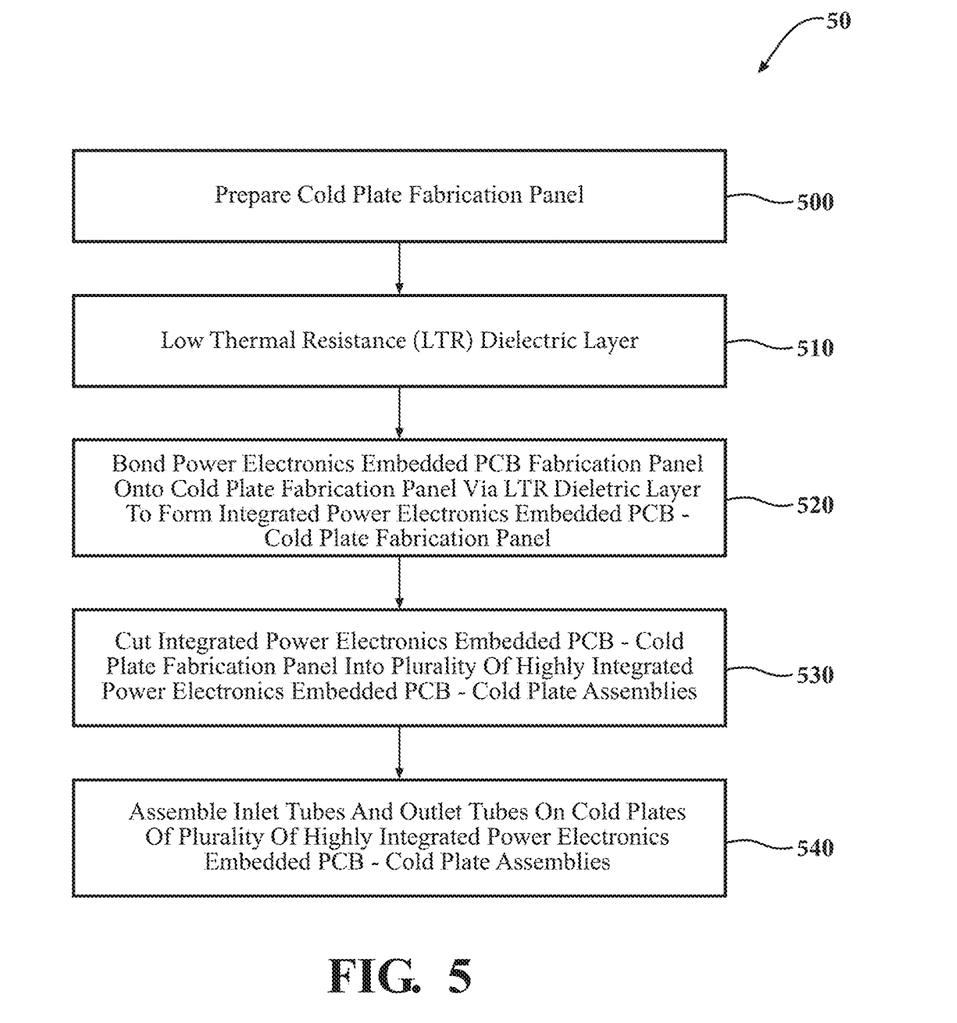
FIG. 5 shows a flow chart for a method of manufacturing a highly integrated power electronics embedded PCB—cold plate assembly according to the teachings of the present disclosure.

Referring now to FIG. 5, a flow chart for a method 50 of manufacturing a plurality of highly integrated power embedded PCB—cold plate assemblies 2 is shown. The method 50 includes preparing a cold plate fabrication panel at 500, preparing or providing a LTR dielectric layer at 510, and bonding a power electronics embedded PCB fabrication panel to the cold plate fabrication panel via the LTR dielectric layer to from an integrated power electronics embedded PCB—cold plate fabrication panel at 520. In some variations, the LTR dielectric layer is laminated onto the cold plate fabrication panel before bonding the bonding the power electronics embedded PCB fabrication panel to the cold plate fabrication panel. In other variations, the LTR dielectric layer is a liquid or film type dielectric material that is applied to the cold plate fabrication or the power electronics embedded PCB fabrication panel before the bonding the bonding the power electronics embedded PCB fabrication panel to the cold plate fabrication panel (e.g., by placing the power electronics embedded PCB fabrication panel and the cold plate fabrication panel with the LTR dielectric layer sandwiched therebetween in an oven for bonding). At 530, the highly integrated power electronics embedded PCB—cold plate fabrication panel is cut into individual highly integrated power electronics embedded PCB—cold plate assemblies, and in some variations, inlet tubes and outlet tubes are assembled or bonded to the individual highly integrated power electronics embedded PCB—cold plate assemblies at 540.

The preceding description is merely illustrative in nature and is in no way intended to limit the disclosure, its application, or its uses. Work of the presently named inventors, to the extent it may be described in the background section, as well as aspects of the description that may not otherwise qualify as prior art at the time of filing, are neither expressly nor impliedly admitted as prior art against the present technology.

The block and/or flow diagrams in the figures illustrate the architecture, functionality, and/or operation of possible implementations of systems, methods, and computer program products according to various embodiments. In this regard, each block in the block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for the general organization of topics within the present disclosure and are not intended to limit the disclosure of the technology or any aspect thereof. The recitation of multiple variations or forms having stated features is not intended to exclude other variations or forms having additional features, or other variations or forms incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should also be understood that the various method steps discussed herein do not have to be conducted in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. An assembly comprising:
   a cold plate;
   a power electronics embedded printed circuit board (PCB); and
   a low thermal resistance (LTR) dielectric layer in direct contact with and directly bonded to the cold plate, the LTR dielectric layer sandwiched between the cold plate and the power electronics embedded PCB such that the power electronics embedded PCB is bonded to the cold plate via the LTR dielectric layer to form a highly integrated power electronics embedded PCB—cold plate assembly.

2. The assembly according to claim 1, wherein the LTR dielectric layer is a ceramic-polymer composite dielectric material.

3. The assembly according to claim 2, wherein the ceramic-polymer composite dielectric material selected from the group consisting of $BaTiO_3$-polymer dielectric materials, $Pb(Zr_xTi_{1-x})O_3$-polymer dielectric materials ($0 \leq x \leq 1$), and $SrTiO_3$ dielectric materials.

4. The assembly according to claim 2, wherein the ceramic-polymer composite dielectric material selected is a $BaTiO_3$-polymer dielectric material.

5. The assembly according to claim 2, wherein the ceramic-polymer composite dielectric material selected is a $Pb(Zr_xTi_{1-x})O_3$-polymer dielectric materials ($0 \leq x \leq 1$).

6. The assembly according to claim 2, wherein the ceramic-polymer composite dielectric material is a $SrTiO_3$ dielectric material.

7. The assembly according to claim 1, wherein the LTR dielectric layer is directly bonded to the power electronics embedded PCB.

8. The assembly according to claim 1, wherein the LTR dielectric layer has an average thickness between about 30 μm and 50 μm.

9. The assembly according to claim 8, wherein the average thickness is between about 35 μm and 45 μm.

10. The assembly according to claim 1, wherein the cold plate is formed from an aluminum alloy.

11. The assembly according to claim 1, wherein the cold plate comprises a fluid chamber configured for a coolant to flow therethrough.

12. The assembly according to claim 11 further comprising porous, mesh-structured, machined, or cast heat sinks disposed within the fluid chamber.

13. A highly integrated power electronics embedded printed circuit board (PCB)—cold plate assembly comprising: a cold plate; a power electronics embedded PCB; and a low thermal resistance dielectric (LTR) layer in direct contact with and directly bonded to the cold plate, the LTR dielectric layer sandwiched between and directly bonded to the cold plate and the power electronics embedded PCB.

14. The highly integrated power electronics embedded PCB—cold plate assembly according to claim 13, wherein the LTR dielectric layer has an average thickness between about 30 μm and 50 μm.

15. The highly integrated power electronics embedded PCB—cold plate assembly according to claim 13, wherein the LTR dielectric layer is a ceramic-polymer composite dielectric material selected from the group consisting of $BaTiO_3$-polymer dielectric materials, $Pb(Zr_xTi_{1-x})O_3$-polymer dielectric materials ($0 \leq x \leq 1$), and $SrTiO_3$ dielectric materials.

16. A method comprising:
   laminating a low thermal resistance (LTR) dielectric layer onto a cold plate fabrication panel such that the LTR dielectric layer is in directly bonded to the cold plate fabrication panel, the cold plate fabrication panel comprising a plurality of individual cold plate units;
   bonding a power electronics embedded printed circuit board (PCB) fabrication panel to the LTR dielectric layer using elevated temperature and elevated pressure and forming an integrated power electronics PCB—cold plate fabrication panel; and
   cutting the integrated power electronics PCB—cold plate fabrication panel into a plurality of individual highly integrated power electronics embedded PCB—cold plate units.

17. The method according to claim 16 further comprising assembling an inlet tube and an outlet tube on the plurality of individual highly integrated power electronics embedded PCB—cold plate units.

18. The method according to claim 16, wherein the LTR dielectric layer is directly bonded to the power electronics embedded PCB fabrication panel.

19. The method according to claim 16, wherein the LTR dielectric layer has an average thickness between about 30 μm and 50 μm.

20. The method according to claim 16, wherein the cold plate fabrication panel is formed from an aluminum alloy, the power electronics embedded PCB fabrication panel comprises a copper containing layer in direct contact with the LTR dielectric layer.

* * * * *